United States Patent
Vollrath et al.

(10) Patent No.: US 6,998,664 B2
(45) Date of Patent: Feb. 14, 2006

(54) INTEGRATED SEMICONDUCTOR CIRCUIT HAVING A CELL ARRAY HAVING A MULTIPLICITY OF MEMORY CELLS

(75) Inventors: Joerg Vollrath, Olching (DE); Stephan Schröder, München (DE); Tobias Hartner, Hamburg (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/787,119

(22) Filed: Feb. 27, 2004

(65) Prior Publication Data

US 2004/0196711 A1   Oct. 7, 2004

(30) Foreign Application Priority Data

Feb. 28, 2003   (DE) .............................. 103 08 872

(51) Int. Cl.
*H01L 27/108* (2006.01)
*H01L 29/76* (2006.01)

(52) U.S. Cl. ...................................... 257/296; 257/301
(58) Field of Classification Search ................ 257/296, 257/300–301

See application file for complete search history.

(56) References Cited

U.S. PATENT DOCUMENTS

| 5,602,772 | A | | 2/1997 | Nakano et al. |
| 5,903,022 | A | * | 5/1999 | Takashima et al. ......... 257/296 |
| 6,459,632 | B1 | * | 10/2002 | Itou ........................... 365/200 |

* cited by examiner

*Primary Examiner*—Phat X. Cao
*Assistant Examiner*—Theresa T. Doan
(74) *Attorney, Agent, or Firm*—Edell, Shapiro & Finnan, LLC

(57) ABSTRACT

An integrated semiconductor circuit includes a cell array having memory cells which can be read by word lines and bit lines. Two bit lines in each case are connected to inputs of the same signal amplifier. In order to compensate for parasitic capacitances which arise at thin sidewall insulations between the patterned word lines and adjacent bit line contacts which connect the bit lines located at a higher level to the active regions located at a deeper level, two additional word lines and dummy contacts of the bit lines are dummy contacts lead past this additional word lines. The additional parasitic capacitances produced by the dummy contacts alter the electrical potential of the respective reference bit line at the signal amplifier in the same way as the parasitic capacitances of activated bit lines, as a result of which the measured differential potential is corrected with respect to the parasitic effects.

10 Claims, 3 Drawing Sheets

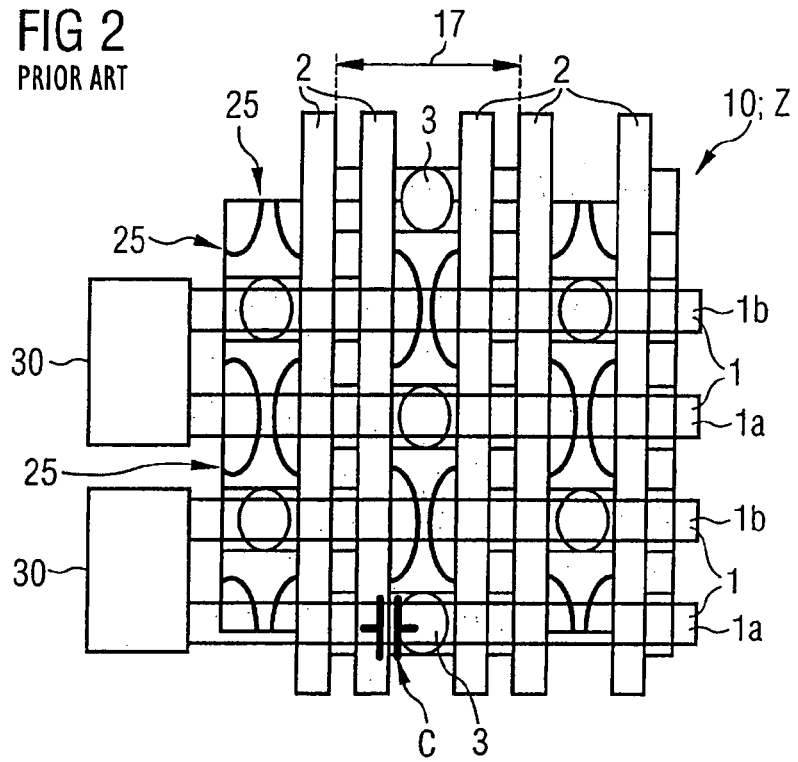
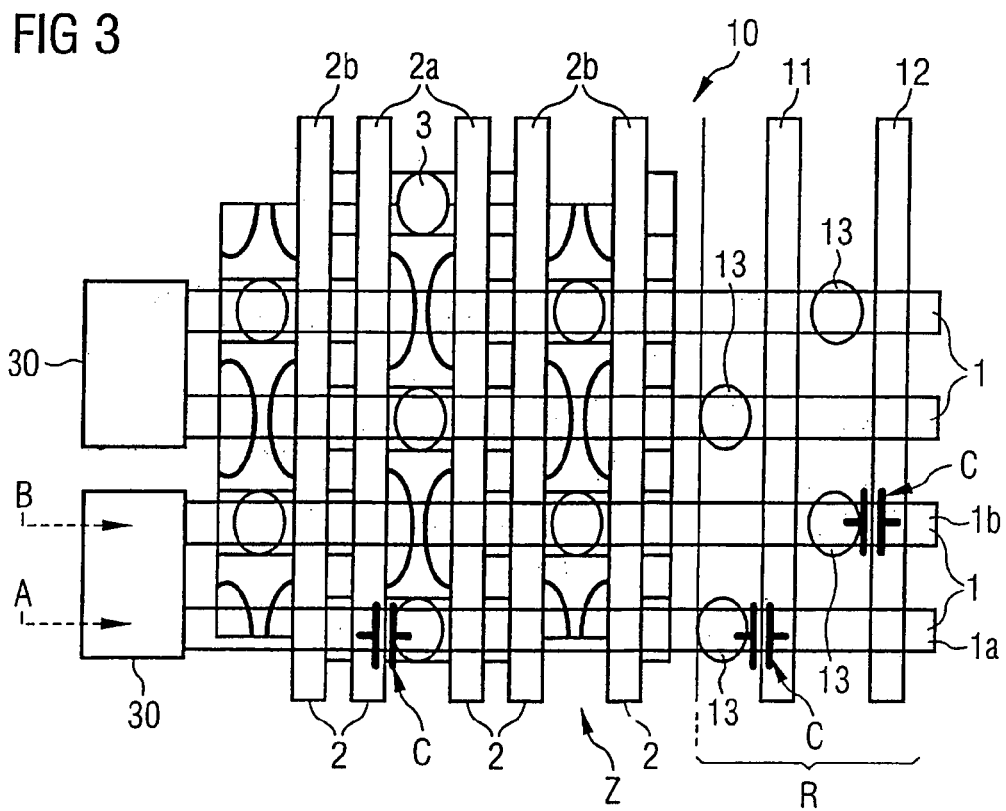

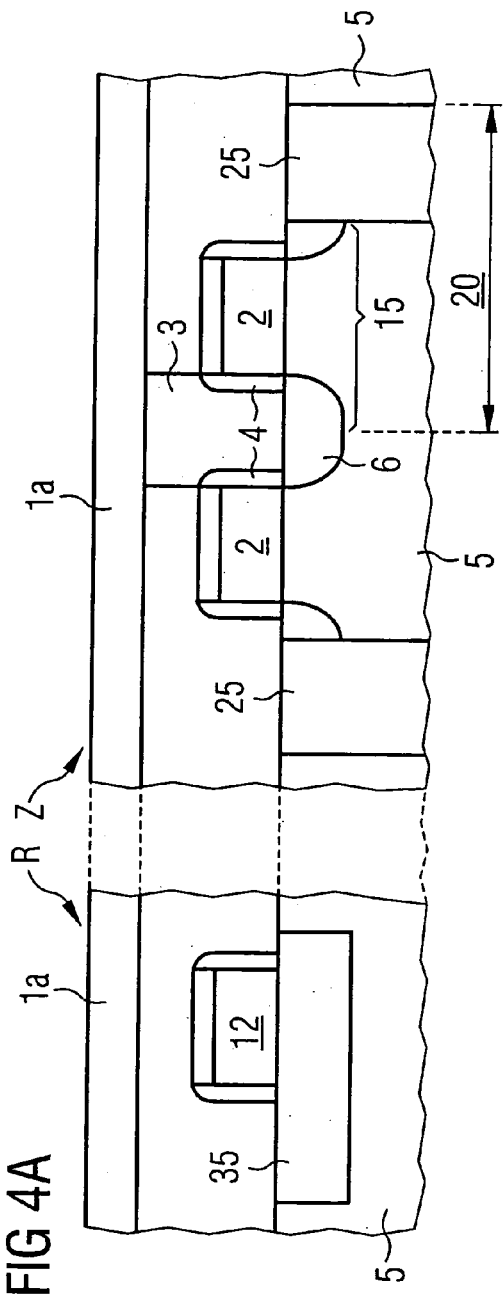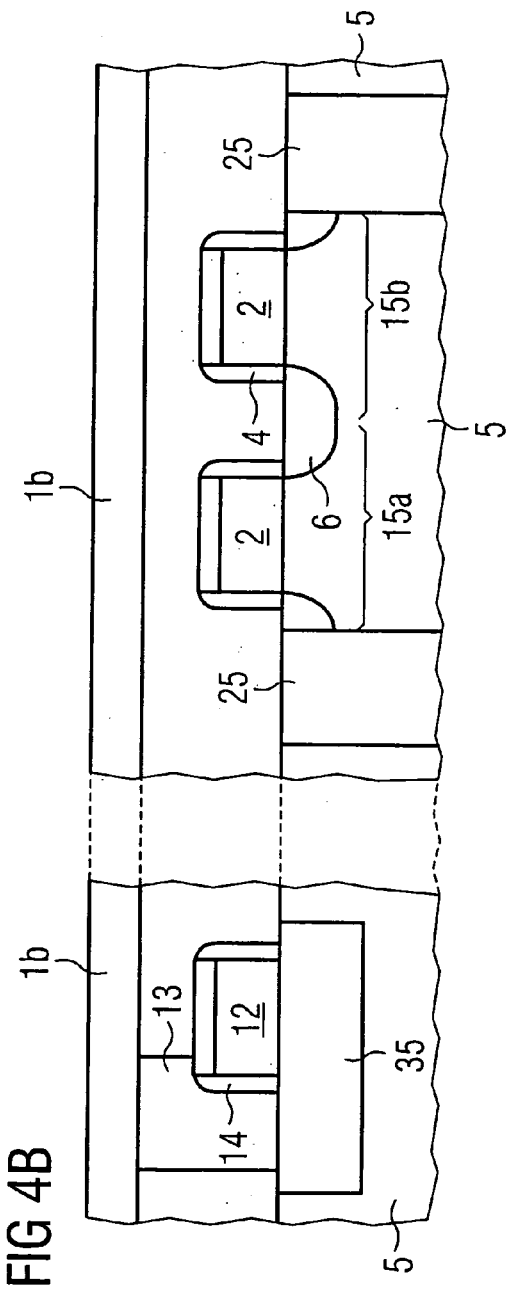

INTEGRATED SEMICONDUCTOR CIRCUIT HAVING A CELL ARRAY HAVING A MULTIPLICITY OF MEMORY CELLS

CROSS REFERENCE TO RELATED APPLICATIONS

This application claims priority under 35 USC §119 to German Application No. 10308872.5, filed on Feb. 28, 2003, and titled "Integrated Semiconductor Circuit Having A Cell Array Having A Multiplicity Of Memory Cells," the entire contents of which are hereby incorporated by reference.

FIELD OF THE INVENTION

The invention relates to an integrated semiconductor circuit having a cell array having a multiplicity of memory cells, which each have a selection transistor and a storage capacitor and can be driven electrically by bit lines and word lines.

BACKGROUND

In such semiconductor circuits, information items stored in the storage capacitors of the memory cells are read out by activation of the bit lines and word lines. The electrical potential of two bit lines are detected by a signal amplifier in order to identify a storage state. The signal amplifier (sense amplifier) acts as voltage differential amplifier which, after the potential of an opened bit line has been read, amplifies this signal and writes it back to the opened memory cell.

Each memory cell is read by activation of a word line and then of a bit line, as a result of which, in the case of a field-effect transistor as selection transistor, the inversion channel produces the electrical connection between the storage capacitor, for example a trench capacitor, and the bit line. The word line serves as gate electrode in the region of the transistor. One of the source/drain regions is conductively connected to the trench capacitor; the other source/drain region is electrically connected by a bit line contact to the bit line assigned to this transistor. The gate electrode, together with the gate oxide and a protective insulation layer, usually a nitride layer, forms a patterned gate layer stack, the sidewalls of which are electrically insulated toward the side by a spacer, i.e., an insulating sidewall covering. The bit line contacts, which electrically connect the bit lines located at a higher level to the source/drain regions of the selection transistors, are arranged between mutually adjacent word lines equipped with spacers. The contact structures or bit line contacts thus connect an upper plane of the bit lines to a lower plane of the doping regions of the selection transistors and pass through a central plane in which the word lines are arranged.

In present-day semiconductor circuits, in particular, memory circuits, disturbance effects, which disadvantageously affect the electrical switching behavior, occur on account of the close spatial arrangement of a wide variety of structures. One disturbance factor is the lateral insulation of the word lines with respect to the contact structures or bit line contacts, said insulation being formed merely by the thin sidewall coverings of the word lines, as a result of which parasitic capacitances are formed.

During the read-out of a memory cell, both the word line and the bit line at whose crossover point the selection transistor of the memory cell is situated are activated. In this case, the electrical charge accumulated in the storage capacitor flows via the selection transistor out of the cell or is distributed between the cell and the connected bit line through to the signal amplifier. As a result, the electrical potential which is then present at the corresponding bit line terminal of the signal amplifier is attenuated with respect to the electrical potential of the charge previously stored in the memory transistor. Nevertheless, a potential difference remains measurable in comparison with another, usually adjacent bit line which is short-circuited with none of the connected storage capacitors.

This parasitic capacitance thus gives rise to an additional potential contribution which is superposed on the electrical potential which is expected on account of the capacitor capacitance and the bit line capacitance at the signal amplifier input. At the other input of the signal amplifier, a non-activated bit line is present, in the case of which a comparable parasitic capacitance does not occur. Consequently, in the signal amplifier, the parasitic capacitance of the activated bit line is superposed on the potential difference of the two bit lines which is actually to be measured.

Such parasitic effects are conventionally compensated for by higher operating voltages and correspondingly higher quantities of charge of an integrated semiconductor circuit. However, this increases the current consumption, the heat supply and the space requirement of the integrated semiconductor circuit per memory cell.

SUMMARY

Elimination of the influence of parasitic capacitances between bit line contacts and word lines without increasing the operating voltage of the semiconductor circuit is desirable, in particular, reducing the influence of parasitic capacitances which occur at sidewall coverings of patterned word lines with respect to adjacent contact structures of bit lines.

In the present invention, at least one first and a second additional word line are provided, which cannot be used for driving selection transistors. Each bit line extends as far as the first or second additional word line and is connected to an additional contact structure, which leads laterally past one of the two additional word lines and represents a dummy contact, and two bit lines. Additional contact structures of the two bit lines lead past different additional word lines. The two bit lines are connected to the same signal amplifier.

According to the invention, in addition to the word lines which in each case drive rows of selection transistors. Additional word lines, i.e., at least two and, in particular, two per memory cell array, which are not directly connected to selection transistors, can be provided. These word lines are compensation lines or dummy word lines, which serve only for compensating for the parasitic capacitances, which occur within the cell array at the word lines, which drive the selection transistors and form the gate electrodes thereof. Each bit line of the cell array can extend outside the cell array as far as the first or as far as the second additional word line. Further contact structures, namely dummy contacts, which are formed in the same way and with the same geometry as the contact structures which drive the memory cells within the memory cell array, can be provided. The dummy contact structures end on an insulation layer and therefore do not produce an actual contact. The parasitic capacitance, which occurs at the sidewall covering of the respectively adjacent first or second additional word line, is important. This additional capacitance can influence the capacitance of the bit line to which the relevant dummy contact is connected, so that the electrical potential can also be altered at the signal amplifier input of this bit line. This additional capacitance can compensate for the parasitic capacitance of that other, second bit line, which is likewise connected to the same signal amplifier. Consequently, the influence of the two capacitances can be equalized in the differential amplifier. As a result, a significant disturbance factor during the read-out of digital storage contents can be eliminated, and the excessively increased operating voltage conventionally used at least in the region of the cell array can be reduced; the reliability of the read-out results can increase at the same time.

Two mutually adjacent bit lines in each case can be connected to the same signal amplifier. In particular, in the case of the folded bit line construction of integrated semiconductor memories, when reading from a bit line, the reference potential used can be that of a bit line adjacent to the bit line.

Additional contact structures of mutually adjacent bit lines can alternately lead past the first additional word line and the second additional word line. This embodiment can provide for, in conjunction with the folded bit line construction, compensation of parasitic capacitances since, for two adjacent bit lines of which in each case one is read, the other has a dummy contact which leads either past the first additional word line or past the second additional word line. The simultaneous activation of this first or second additional word line in addition to the word line with which the relevant memory cell to be read is driven can enable the formation of a compensating parasitic capacitance at the second bit line, which is not to be read.

Each of the two additional word lines can be activated jointly with an arbitrary word line past which lead contact structures exclusively of those bit lines which do not have an additional contact structure leading past the respective additional word line. According to this embodiment, one of the two additional word lines, i.e., the first or the second additional word line, can be assigned to each of the word lines required for driving memory cells and can be activated at the same time as it. The assignment takes place such that, for a specific bit line which, for example, has a dummy contact adjacent to the first additional word line, this additional word line can be assigned to each of the word lines in the cell array for which the relevant bit line does not have a bit line contact leading past this respective word line in the cell array. Conversely, such an additional word line for which the bit line under consideration does not have an adjacent dummy contact can be assigned those word lines of the cell array for which the bit line under consideration actually has a bit line contact leading past this respective word line of the cell array. Consequently, a potential alteration on account of a parasitic capacitance can arise at all the signal amplifier inputs, i.e., either on account of the opened memory cell or, according to the invention, on account of the dummy contact of the assigned additional dummy word line. The measured differential potential can be purged with respect to the parasitic capacitances.

The storage capacitors can be trench capacitors arranged in the semiconductor substrate. The bit lines can be arranged on the semiconductor substrate at a greater distance from the semiconductor substrate than the word lines.

In particular, the additional contact structures, which lead past the additional word lines, end on a trench isolation of the semiconductor substrate, whereas the contact structures of the remaining word lines in each case lead into a common doping region of two selection transistors. The trench isolations can be situated below the bit line contacts, which lead past the two additional word lines adjacent to them. One of the remaining bit line contacts adjoining two selection transistors can be opened by the activated word line.

The first and the second additional word line can be arranged beside one another at an edge of the cell array. As an alternative the word lines may also be arranged on opposite edges of the cell array, or, in the case of a divided cell array with a plurality of subarrays, within the array.

The selection transistors can be field-effect transistors with the gate electrodes formed by the word lines. In particular, the lateral insulations between the contact structures and the word lines can be sidewall coverings, i.e., spacers of patterned gate layer stacks.

The semiconductor circuit formed according to the invention can be preferably a dynamic random access memory, i.e., DRAM.

BRIEF DESCRIPTION OF THE DRAWINGS

The invention can be described below with reference to the figures in which:

FIG. 2 shows a conventional integrated semiconductor circuit,

FIG. 3 shows a semiconductor circuit according to the invention, and

FIGS. 4A and 4B show cross-sectional views of two mutually adjacent bit lines from FIG. 3.

DETAILED DESCRIPTION

Figure 1:
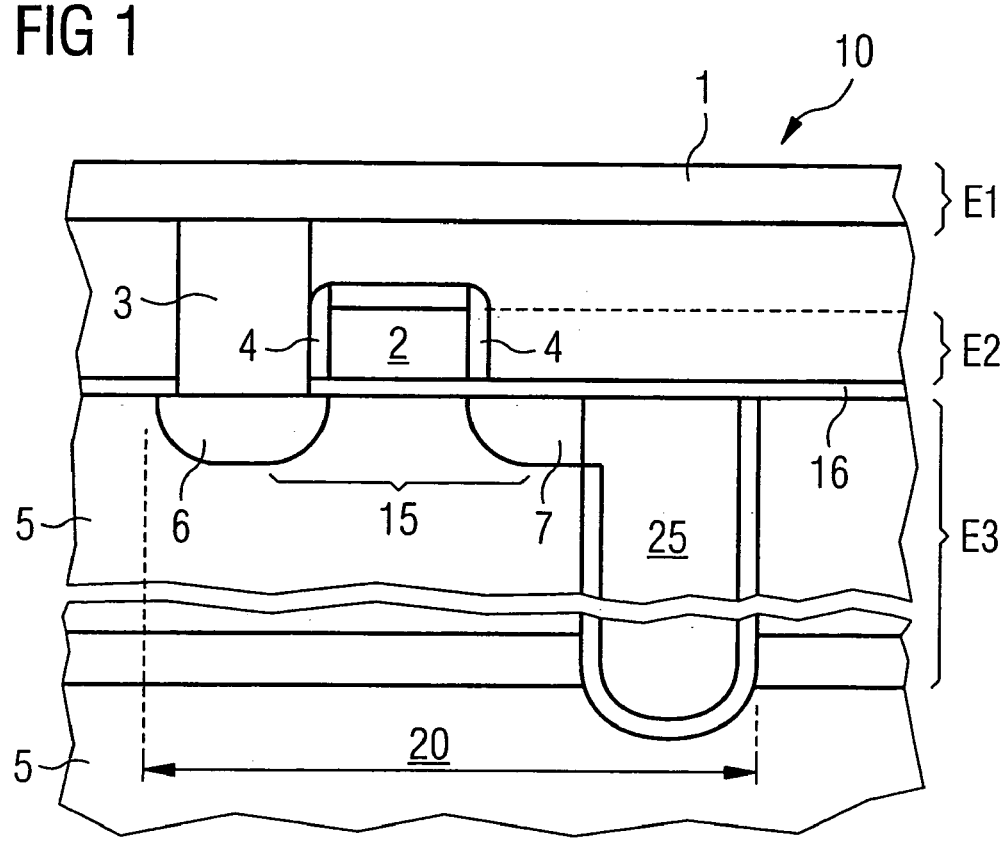
FIG. 1 shows a memory cell of an integrated semiconductor circuit.

FIG. 1 shows a memory cell 20 as is typically formed in the cell array of an integrated semiconductor memory 10 in the case of a buried capacitor 25 with planar selection transistor 15. The selection transistor can be opened by activation of a word line 2, which forms the gate electrode of the transistor, and a bit line 1, which is connected to one of the source/drain regions 6 of the transistor via a contact structure 3. The trench capacitor 25 can have electrodes (not specifically designated), of which one can be buried deep in the substrate 5 and the other can form the filling of the deep trench within the capacitor dielectric at the trench wall. The storage capacitor can be situated essentially in a lower plane E3 extending down deep into the substrate interior. Above the substrate surface, on a gate oxide layer 16, the word lines 2 can be situated at the level of a plane E2, and the bit lines 1 can be situated in a higher plane E1. The contact structures 3 can be situated in the central plane E2, and can be laterally insulated from the word lines 2 by the spacers 4 thereof, as a result of which parasitic capacitances can form.

FIG. 2 shows a plan view of a conventional semiconductor circuit having a multiplicity of memory cells. Illustrated on the left are signal amplifiers (sense amplifiers) 30, two bit lines 1a, 1b in each case being connected to the inputs of the amplifiers. The word lines 2 run perpendicular to the bit lines, semicircular contours of the trench capacitors 25 located at a deeper level being discernible between the word lines. The contact structures 3 extend at the level of the word lines 2, which contact structures connect a bit line running above the plane of the drawing to a common source/drain doping region of two memory cells or selection transistors which are adjacent in the bit line direction. The active region of the two selection transistors is indicated by the double arrow 17. The active regions can form a diagonal grid corresponding to the grid of the bit line contacts or contact structures 3 illustrated. During the read-out of a memory cell, the assigned bit line can be activated and read with the adjacent bit line at the common signal amplifier. The activated bit line can be parasitically coupled via the bit line contact to the activated word line which has been opened for the read-out of the corresponding memory cell. A parasitic capacitance can arise as a result, as illustrated by the indicated capacitance symbol C and the symbol of a plate capacitor, for example, at the crossover point between the second word line from the left and the bit line contact of the bottom-most bit line. The adjacent bit line (the second bit line from the bottom) does not have such a parasitic capacitance, for which reason the parasitic capacitance C at the lower bit line corrupts the electrical potential difference between the two bit lines.

FIG. 3 shows a semiconductor circuit according to the invention, in which two additional word lines 11 and 12 are provided in addition to the word lines 2 of the cell array Z. The bit lines can extend to at least one of the two additional word lines 11, 12 and each bit line 1 can have an additional contact structure, i.e., a dummy contact 13 adjacent to one of the two additional word lines 11, 12, at which a parasitic capacitance likewise occurs. The capacitance can be likewise illustrated by a symbol of a plate capacitor at two regions C. Compensation of two parasitic capacitances can be effected during the read-out of the memory cell at the point of intersection between the second word line from the left and the bottom-most bit line by virtue of the fact that the further word line 12 can be activated in addition to the second word line from the left. As a result, at the second bit line from the bottom, which can be read jointly with the bottom-most bit line at the same signal amplifier 30, a parasitic capacitance can arise between the dummy contact 13 and the second additional word line 12, which can be activated at the same time as the second word line from the left. The first additional word line 11 is not activated, so that the parasitic capacitance illustrated at this additional word line 11 does not occur. Consequently, a parasitic capacitance C in each case can occur at the two mutually adjacent bit lines 1a, 1b, which capacitances mutually compensate for one another in the signal amplifier 30. Computationally, the electrical potential of a bit line is generally determined according to the equation $$Vbl=(Vc-Vbleq)Cc/(Cc+Cbl)+Vwl,$$

where Vbl denotes the measured potential of the bit line, Vc denotes the electrical potential of the memory cell, Vbleq denotes the averages potential of a bit line between on state and off state (the arithmetic mean of the two potentials), Cc denotes the capacitance of the memory cell, Cbl denotes the capacitance of the bit line, and Vwl denotes the potential shift on account of the parasitic capacitor. The last term Vwl leads to the superposition and disturbance of the bit line potential to be measured. In the case of the semiconductor circuit according to the invention as shown in FIG. 3, however, this term Vwl also occurs on the adjacent reference bit line, i.e., not at the point of intersection with the opened word line of the cell array, but rather at the simultaneously activated additional word line 12 assigned to this word line and the adjacent dummy contact 13. The two capacitances C can lead to equal terms Vwl in the above equation, which compensate for one another in the comparison of the two bit line potentials. The bit line potential of the selected memory cell measured in the signal amplifier thus corresponds to a bit line potential $$Vbl=(Vc-Vbleq)Cc/(Cc+Cbl).$$

On account of the compensation according to the invention, the conventional excessive voltage increases of the order of magnitude of about 300 mV can be obviated; the current consumption of the semiconductor circuit can decrease.

FIGS. 4A and 4B show cross-sectional use of the semiconductor memory according to the invention from FIG. 3 along the section lines A and B, i.e., along the mutually adjacent bit lines 1a and 1b. FIGS. 4A and 4B are mirror-inverted with respect to FIG. 3. In these figures, the cell array Z appears on the right and the respective additional word line 11 or 12 on the left thereof. As in FIG. 3, distances and orders of magnitude are not to scale. In particular, parasitic capacitances for each bit line occur as one of the two additional word lines 11 or 12.

In FIG. 4A, for the read-out of the right-hand memory cell 20, the word line 2 of the right-hand selection transistor 15 is switched to "high"; the bit line 1a from FIG. 3 can likewise be activated and can form a parasitic capacitor via the bit line contact 3 at the sidewall oxide 4. To the left of the cell array Z, the second additional word line 12 is represented in the edge region, which word line is activated at the same time as the right-hand word line 2 represented in FIG. 4A and is therefore the only one of the two additional word lines 11, 12 that can form a further or a plurality of further parasitic capacitances. However, the bit lines 1a do not have a further bit line contact or dummy contact 13 beside the additional word line 12, so that only the parasitic capacitance at the sidewall oxide 4 affects the potential of the bit line 1a at the signal amplifier input.

FIG. 4B shows a section along the bit line 1b, both the right-hand word line 2 and the second additional word line 12 likewise again being activated, i.e., at the same time, as in FIG. 4A. The reference bit line 1b does not have a bit line contact adjacent to the right-hand word line 2. However, it has a dummy contact 13 at the activated word line 12, as a result of which a further parasitic capacitance arises at the sidewall oxide 14 thereof. The capacitance can influence the bit line potential of the reference bit line 1b in the same way as the parasitic capacitance at the sidewall oxide 4 in FIG. 4A influences the bit line potential of the activated bit line 1a; the two capacitances can mutually compensate for one another and produce the desired, corrected measurement result for the bit line potential.

The semiconductor circuit formed according to the invention thus enables a more reliable read-out of digital information items stored in the stored capacitors and the reliable evaluation of the information items as either digital zero or digital one. The additional parasitic capacitances produced by the dummy contacts can alter the electrical potential of the respective reference bit line at the signal amplifier in the same way as the parasitic capacitances of activated bit lines, as a result of which the measured differential potential can be corrected with respect to the parasitic effects.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1, 1a, 1b Bit lines
2, 2a, 2b Word lines
3 Contact structure (bit line contact)
4 Sidewall insulation 5 Semiconductor substrate
6 Common source/drain region
7 Source/drain region on trench side
10 Semiconductor circuit
11 First additional word line
12 Second additional word line
13 Additional contact structure (dummy contact)
14 Sidewall insulation of an additional word line
15 Selection transistor
16 Gate oxide
17 Double arrow
20 Memory cell
25 Storage capacitor
30 Signal amplifier
35 Trench isolation
C Parasitic capacitance
E1, E2, E3 Planes
R Edge region
Z Cell region

We claim:

1. An integrated semiconductor circuit, comprising:
   a cell array, the cell array having a plurality of memory cells, each memory cell having a selection transistor and a storage capacitor and capable of being driven electrically by bit lines and word lines;
   the storage capacitors, the bit lines, and the word lines being arranged in different planes on or in a semiconductor substrate;
   a plurality of electrical contact structures, the electrical contact structures being arranged at the level of the word lines, the contact structures electrically connecting the bit lines to the selection transistors of the memory cells,
   the contact structures leading past the word lines and being insulated from the word lines by lateral insulations; and
   in each case, at least two bit lines being connected to a common signal amplifier,
   wherein at least one first and a second additional word line are provided, which cannot be used for driving selection transistors, each bit line extending as far as the first or second additional word line and is connected to an additional contact structure, the additional contact structure leading which leads laterally past one of the two additional word lines and representing a dummy contact, additional contact structures of two bit lines leading past different additional word lines, in each case, the two bit lines being connected to the same signal amplifier.

2. The semiconductor circuit as claimed in claim 1, wherein two mutually adjacent bit lines in each case are connected to the same signal amplifier.

3. The semiconductor circuit as claimed in claim 1, wherein the additional contact structures of mutually nearest adjacent bit lines alternately lead past the first additional word line and the second additional word line.

4. The semiconductor circuit as claimed in claim 1, wherein each of the two additional word lines can be activated jointly with an arbitrary word line past which lead contact structures exclusively of those bit lines which do not have an additional contact structure leading past the respective additional word line.

5. The semiconductor circuit as claimed in claim 1, wherein the storage capacitors are trench capacitors arranged in the semiconductor substrate, and the bit lines are arranged on the semiconductor substrate at a greater distance from the semiconductor substrate than the word lines.

6. The semiconductor circuit as claimed in claim 1, wherein the additional contact structures which lead past the additional word lines end on a trench isolation of the semiconductor substrate, whereas the contact structures of the remaining word lines in each case lead into a common doping region of two selection transistors.

7. The semiconductor circuit as claimed in claim 1, wherein the first and the second additional word line are arranged beside one another at an edge of the cell array.

8. The semiconductor circuit as claimed in claim 1, wherein the selection transistors are field-effect transistors, the gate electrodes of the field-effect selection transistors being formed by the word lines.

9. The semiconductor circuit as claimed in claim 1, wherein the lateral insulations between the contact structures and the word lines are sidewall coverings of patterned gate layer stacks.

10. The semiconductor circuit as claimed in claim 1, wherein the semiconductor circuit is a dynamic random access memory.

* * * * *